United States Patent
Raieszadeh et al.

(10) Patent No.: US 9,197,188 B2
(45) Date of Patent: Nov. 24, 2015

(54) WIDE RANGE CONTINUOUSLY TUNABLE CAPACITOR BANK

(75) Inventors: Mina Raieszadeh, Ann Arbor, MI (US); Yonghyun Shim, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 438 days.

(21) Appl. No.: 13/613,877

(22) Filed: Sep. 13, 2012

(65) Prior Publication Data

US 2014/0070905 A1   Mar. 13, 2014

(51) Int. Cl.
 *H03H 7/01* (2006.01)
 *H03H 7/09* (2006.01)
 (Continued)

(52) U.S. Cl.
 CPC ............ *H03H 7/12* (2013.01); *C25D 1/003* (2013.01); *H03H 3/00* (2013.01); *H03H 5/12* (2013.01); *H03H 7/0161* (2013.01); *H03H 7/09* (2013.01); *H03H 7/38* (2013.01); *H03H 7/42* (2013.01); *H03H 2001/0064* (2013.01); *H03H 2007/008* (2013.01); *H03H 2210/025* (2013.01); *H03H 2210/033* (2013.01); *H03H 2210/036* (2013.01)

(58) Field of Classification Search
 CPC ......... H03H 7/38; H03H 7/0161; H03H 7/12; H03H 7/0115; H03H 7/42; H03H 3/00; H03H 5/12; H03H 2001/0064; H03H 2007/008; H03H 2210/025; H03H 2210/036; H03H 2210/033; H03H 7/09
 USPC ...................... 333/124, 174, 186, 25, 33, 175
 See application file for complete search history.

(56) References Cited

U.S. PATENT DOCUMENTS

| | | | | |
|---|---|---|---|---|
| 5,917,387 A | * | 6/1999 | Rice et al. | 333/174 |
| 6,097,269 A | * | 8/2000 | Hernandez | 333/174 |

(Continued)

FOREIGN PATENT DOCUMENTS

| | | |
|---|---|---|
| JP | 2012142285 A | 7/2012 |
| KR | 1020050071012 A | 7/2005 |
| KR | 1020110066395 A | 6/2011 |

OTHER PUBLICATIONS

International Search Report for application No. PCT/US2013/059433, dated Sep. 12, 2013, 4 pages.
Written Opinion of the International Searching Authority for application No. PCT/US2013/059433, dated Sep. 12, 2013, 8 pages.

*Primary Examiner* — Benny Lee
*Assistant Examiner* — Rakesh Patel
(74) *Attorney, Agent, or Firm* — Reising Ethington P.C.

(57) ABSTRACT

A wide range tunable capacitor bank is provided. The capacitor bank comprises a variable capacitor, the capacitance value of which is adjustable within a predetermined capacitance range defined by a minimum capacitance value and a maximum capacitance value. The capacitor bank further comprises one or more switched capacitors each electrically connected in circuit to the variable capacitor. The variable capacitor is configured to allow the capacitance value thereof to be adjusted within the predetermined capacitance range and the one or more switched capacitors are configured to be selectively actuated to permit continuous tuning of the capacitor bank over a second capacitance range that is greater than the predetermined capacitance range. Applications in which the capacitor bank may be implemented, and a method of fabricating an integrated system comprising a plurality of passive components, such as, for example, those of the capacitor bank and high quality factor inductors, are also provided.

21 Claims, 6 Drawing Sheets

(51) Int. Cl.
*H03H 7/12* (2006.01)
*H03H 3/00* (2006.01)
*H03H 5/12* (2006.01)
*C25D 1/00* (2006.01)
*H03H 7/42* (2006.01)
*H03H 7/38* (2006.01)
*H03H 1/00* (2006.01)
*H03H 7/00* (2006.01)

(56) References Cited

U.S. PATENT DOCUMENTS

| | | |
|---|---|---|
| 6,593,672 B2 | 7/2003 | Ma et al. |
| 7,155,182 B2 * | 12/2006 | Eckl et al. .................. 455/180.4 |
| 2005/0275474 A1 | 12/2005 | Geynet et al. |
| 2006/0125572 A1 * | 6/2006 | van der Weide et al. ....... 333/20 |
| 2006/0140646 A1 * | 6/2006 | Naniwada ..................... 398/201 |

* cited by examiner

WIDE RANGE CONTINUOUSLY TUNABLE CAPACITOR BANK

TECHNICAL FIELD

The present disclosure relates generally to capacitor banks, and more particularly, to wide range continuously tunable capacitor banks and applications or implementations thereof.

BACKGROUND

There is an increasing demand for high-performance radio frequency (RF) front-end modules and components for use in applications such as, for example, advanced ground mobile radios. More particularly, it is becoming increasing necessary for devices such as advanced ground mobile radios to support various types of waveforms, including very high frequency (VHF) and ultra-high frequency (UHF) bands, which will require reconfigurable RF front-ends. One of the key challenges in developing such reconfigurable modules is to reduce the size and weight of the module while also supporting multiple communication standards.

One of the key components in RF front-ends is the RF bandpass filter. As such, the filter needs to satisfy requirements of multiple frequency band coverage and good RF performance, all in a small form factor. Various types of filters have been developed to attempt to adequately satisfy these requirements. For example, one type of filter is that based on CMOS technology. While CMOS-based filters offer a small size, the quality factor (Q) of the CMOS-based passive components that form the filter is low. The low Q of these components makes it hard to achieve a sufficiently low insertion loss for the filter unless Q enhancement techniques using active components are utilized.

Another type of filter that has been developed is that fabricated using micro-electromechanical system (MEMS) technology. More particularly, in one instance, a tunable bandpass filter designed in a second-order coupled resonator configuration has been developed. This particular filter was tuned using MEMS tunable capacitors that were employed in the resonator circuit or tank of the filter. However, in this implementation, a large-value fixed capacitor was placed in parallel with a smaller-value MEMS tunable capacitor to obtain the required capacitance value, which undesirably reduces the tuning range of the filter to less than 25%.

In other examples, switched capacitor banks with non-continuous digital tuning ranges were used to tune the frequency, and/or the bandwidth of the filter. The drawback of this approach is the low resolution of the digital tuning.

Thus, among other drawbacks of current implementations of continuously tunable filters, the tuning ranges thereof are limited by the tuning range(s) of the MEMS capacitors and inductive elements incorporated in the filter/resonator circuits thereof, and thus, they do not offer wide range tuning.

Accordingly, there is a need for RF front-ends and/or components thereof that meet requirements such as, for example, multiple frequency band coverage, continuous tuning, and good RF performance all in a small form factor, while also minimizing and/or eliminating one or more of the above-identified deficiencies.

SUMMARY

According to one embodiment, there is provided a wide range tunable capacitor bank comprising a variable capacitor, the capacitance value of which is adjustable within a predetermined capacitance range defined by a minimum capacitance value and a maximum capacitance value. The capacitor bank further comprises one or more switched capacitors, each electrically connected in circuit to the variable capacitor. The variable capacitor is configured to allow the capacitance value thereof to be adjusted within the predetermined capacitance range and the one or more switched capacitors are configured to be selectively actuated to permit continuous tuning of the capacitor bank over a second capacitance range that is greater than the predetermined capacitance range.

According to another embodiment, there is provided an electric circuit comprising one or more resonator circuits, wherein each of the one or more resonator circuits comprises a continuously tunable capacitor bank. The capacitor bank comprises a variable capacitor, the capacitance value of which is adjustable within a predetermined capacitance range defined by a minimum capacitance value and a maximum capacitance value. The capacitor bank further comprises one or more switched capacitors, each electrically connected in circuit to the variable capacitor. The variable capacitor is configured to allow the capacitance value thereof to be adjusted within the predetermined capacitance range and the one or more switched capacitors are configured to be selectively actuated to permit continuous tuning of the capacitor bank over a second capacitance range that is greater than the predetermined capacitance range. The resonator circuit further comprises at least one inductive element electrically connected in circuit to the continuously tunable capacitor bank.

According to another embodiment, there is provided a method of fabricating a micro-electromechanical system (MEMS) comprising one or more passive electrical components. The method comprises a step of depositing and patterning a first metal layer on a substrate. The method further comprises the steps of depositing and patterning a dielectric layer on top of the first metal layer, and a depositing and patterning a first sacrificial layer on top of at least one of the dielectric layer and the first metal layer. The method still further comprises a step of electroplating a second metal layer on top of at least one of the first sacrificial layer and the substrate. The method yet still further comprise the steps of depositing and patterning a second sacrificial layer on top of at least one of the second metal layer and the first metal layer, and electroplating a third metal layer onto at least one of the second sacrificial layer and the substrate. The method further comprises a step of removing the sacrificial layers to form one or more gaps between those layers having the first or second sacrificial layers disposed therebetween.

DESCRIPTION OF THE DRAWINGS

Preferred exemplary embodiments will hereinafter be described in conjunction with the appended drawings, wherein like designations denote like elements, and wherein:

FIG. 2b is a simplified cross-section view of a portion of the variable capacitor illustrated in FIG. 2a;

DETAILED DESCRIPTION OF THE EMBODIMENTS

Figure 1:
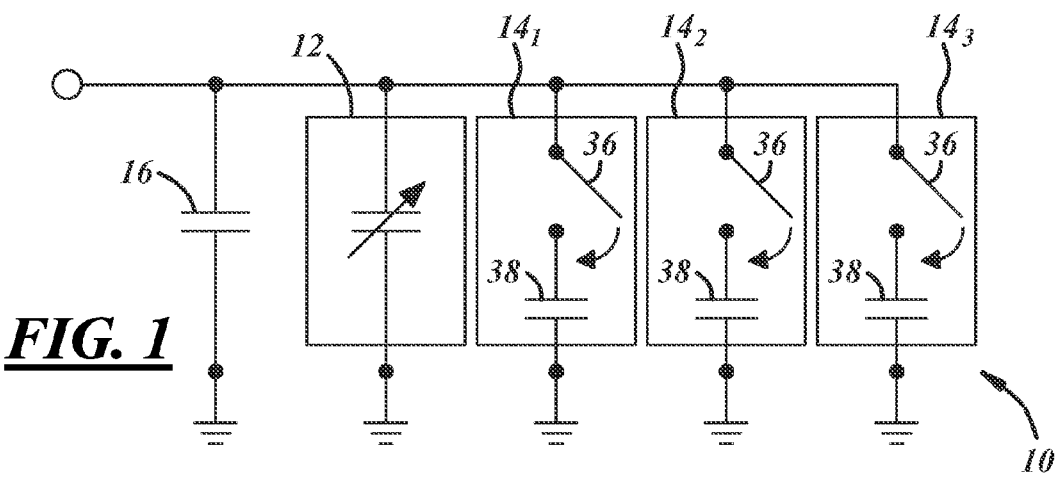
FIG. 1 is a schematic diagram of an exemplary embodiment of a wide range continuously tunable capacitor bank.

Referring now to the drawings wherein like reference numerals are used to identify the same or similar components in the various views, FIG. 1 illustrates one exemplary embodiment of a wide range continuously tunable capacitor bank 10 that may, as will be described in greater detail below, find application in any number of radio frequency (RF) front-end components, such as, for example, tunable resonator circuits, wide range tunable RF filters, matching networks, tunable antennas, phase shifters, and the like. In an exemplary embodiment, the capacitor bank 10 comprises at least one variable capacitor 12 (e.g., a varactor) and one or more switched capacitors 14 (i.e., capacitors $14_1, 14_2, 14_3 \ldots 14_N$) that combine to allow for continuous wide range tuning of the capacitor bank 10. While the capacitor bank 10 may include one or more variable capacitors 12, for purposes of illustration and clarity, the description below will be limited to an embodiment wherein the capacitor bank 10 comprises a single variable capacitor. It will be appreciated, however, that capacitor banks having two or more variable capacitors remain within the spirit and scope of the present disclosure. In an exemplary embodiment, the capacitor bank 10 may further include a fixed capacitor 16, the purpose of which is to set an initial, minimum capacitance value of the capacitor bank 10.

In an exemplary embodiment, the variable capacitor 12 comprises a continuously tunable capacitor, the capacitance value of which may be adjusted or tuned within a predetermined capacitance or tuning range defined by a minimum capacitance value and a maximum capacitance value. The particular range of the variable capacitor 12 may be dependent upon a number of factors, including, for example, desired performance characteristics and design standards or parameters of the capacitor bank 10 and/or an application in which it is implemented. Therefore, the present disclosure is not meant to be limited to any particular tuning ranges. However, for purposes of illustration, in an exemplary embodiment, the tuning range may be on the order of 5:1 or greater. For instance, in the example to be provided and described below, the capacitance or tuning range of the variable capacitor 12 is on the order of 0.2-1.4 pF, or 7:1.

Figure 2A:
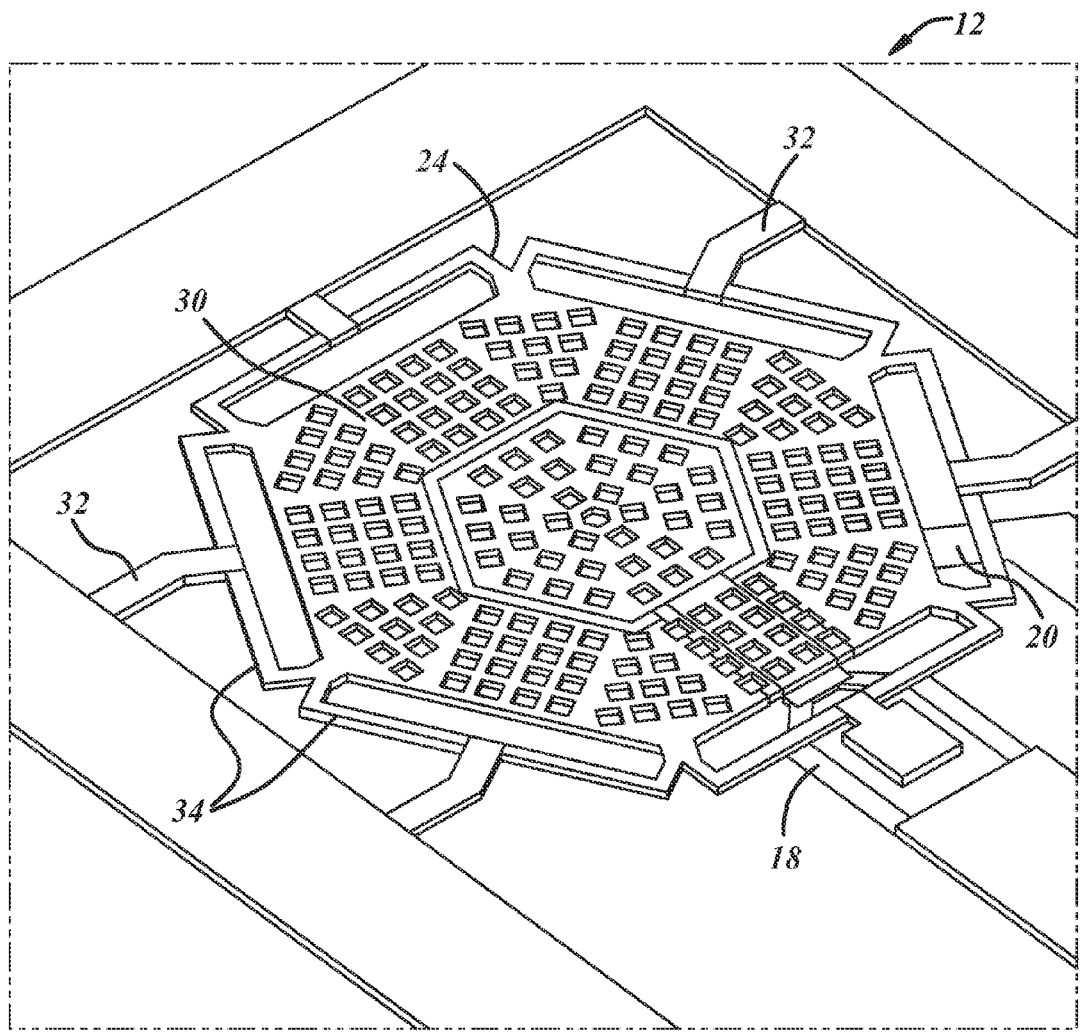
FIG. 2a is a top view of an exemplary variable capacitor of the capacitor bank illustrated in FIG. 1.
Figure 2B:
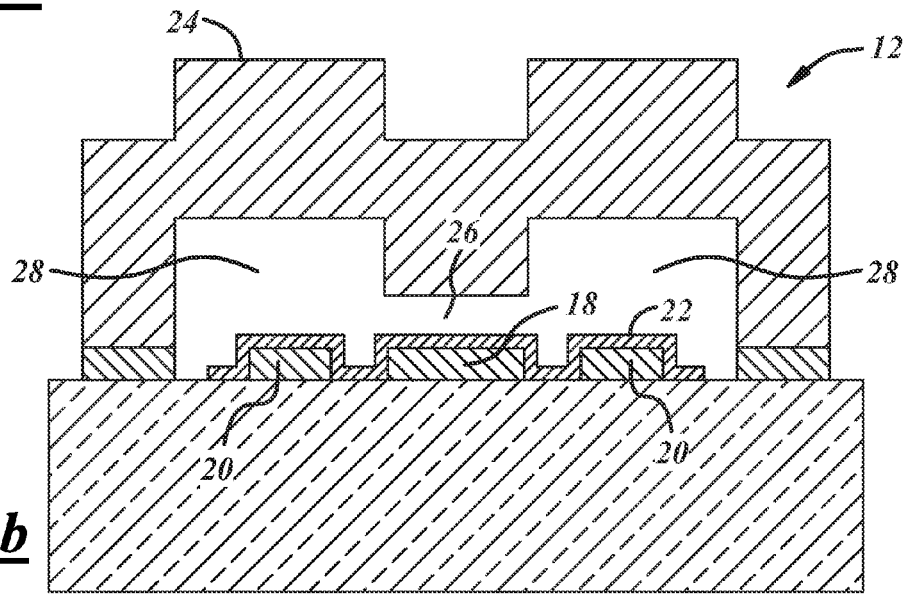

With particular reference to FIGS. 2a and 2b, in an exemplary embodiment, the variable capacitor 12 may comprise a high quality factor (Q) (e.g., Q>100) and continuously tunable micro-electromechanical system (MEMS) variable capacitor fabricated using surface micro-fabrication technology. As illustrated in FIG. 2b, the variable capacitor 12 may comprise a plurality of electrodes, including an RF or sense electrode 18 and a separate biasing or actuation electrode 20 (which, as illustrated in FIG. 2b, may have a ring shape that surrounds the sense electrode 18), disposed on a substrate. The substrate may comprise a single- or multi-layer substrate, and in one exemplary embodiment, comprises a glass substrate (e.g., a Borosilicate glass substrate). In any event, the sense and actuation electrodes 18, 20 may be formed of a metallic material, such as, for example, gold. In an exemplary embodiment, the electrodes 18, are formed of gold having thickness of approximately 0.5 μm. In an exemplary embodiment, each of the sense and actuation electrodes 18, 20 also have a dielectric layer 22 formed thereon. The dielectric layer 22 may be formed of a number of dielectric materials and may have any number of thicknesses. In an exemplary embodiment, the dielectric layer 22 comprises a 500-1000 A° thick aluminum oxide ($Al_2O_3$) layer.

The variable capacitor 12 may further comprise a top electrode or membrane 24, a portion of which is suspended over the electrodes 18, 20, as well as a capacitance sense gap 26 disposed between the top membrane 24 and the sense electrode 18, and an actuation gap 28 disposed between the top membrane 24 and the actuation electrode 20.

The top membrane 24 may be formed of a number of materials, such as for example, gold. In order to achieve a high Q of the variable capacitor 12, in an exemplary embodiment, the top membrane 24 is formed of gold having a thickness of approximately 4 μm. As will be described below, the top membrane 24 has a flexible center portion 30 configured to move up and down to allow for the electrostatic tuning of the variable capacitor. The outer portions 32 of the top membrane are configured to be anchored in place, and portions 34 of the top membrane 24 disposed between the center, flexible portion and the outer, anchored portions are configured to serve as springs to help facilitate the movement of the center portion 30. Further, in an exemplary embodiment, the top membrane 24 comprises a shared ground electrode.

As briefly described above, the variable capacitor 12 may be configured to be electrostatically tuned. More particularly, and as is well known in the art, the variable capacitor 12 may be electrostatically tuned in response to a bias voltage applied across the actuation gap 28 between the actuation electrode 20 and the membrane 24. The application of the bias voltage results in the creation of an attractive electrostatic force that, depending on the magnitude, may cause the flexible portion 30 of the membrane 24 to move within the sense gap 26 toward the sense electrode 18. The movement of the membrane 24 toward the sense electrode 18 causes the capacitance value of the variable capacitor 12 to increase. Conversely, when the electrostatic force is removed or at least sufficiently lessened, the springs (e.g., portions 34 of the top membrane 24) cause the flexible portion 30 to move away from the sense electrode 18, thereby reducing the capacitance value of the variable capacitor 12. Accordingly, by adjusting the applied bias voltage within a predetermined voltage range (e.g., between 0 VDC and a value equal to or less than the pull-in voltage of the variable capacitor 12 (e.g., 40 VDC)), the capacitance value of the variable capacitor 12 may likewise be adjusted. For a number of reasons, including, for example, to achieve continuous wide range tuning of the variable capacitor, the respective sense and actuation gaps 26, 28 may be sized so that the sense gap 26 is smaller than the actuation gap 28, and that there is a particular ratio between the sizes of the two gaps. In an exemplary embodiment, that ratio (actuation:sense) is at least 3:1. More particularly, in an exemplary embodiment, the distance between the actuation electrode 20 and the membrane 24 is 2 μm, and the distance between the sense electrode 18 and the membrane 24 is 0.5 μm, thereby resulting in a ratio (actuation:sense) of 4:1.

It will be appreciated by those of ordinary skill in the art that while certain materials (gold and aluminum dioxide) and dimensions of both the materials and the components (e.g., electrodes, sense/actuation gaps, etc.) of the variable capacitor 12 are specifically provided above, the present disclosure is not meant to be limited either to those materials or dimensions. Rather, components having suitable dimensions or being formed of suitable materials other than those described above, and materials having suitable dimensions other than those identified above, remain within the spirit and scope of the present disclosure.

Turning back to FIG. 1, the switched capacitor(s) 14 of the capacitor bank 10 will now be described. The capacitor bank 10 may include one or a plurality of switched capacitors 14, each of which is/are connected in circuit with the variable capacitor 12 and, if applicable, the other switched capacitors 14 and/or the fixed capacitor 16. For example, in the embodiment illustrated in FIG. 1, the capacitor bank 10 includes a plurality of switched capacitors 14, each of which is electrically connected in circuit with the variable capacitor 12, the other of the switched capacitors 14, and the fixed capacitor 16. In the illustrated embodiment, each of the switched capacitors 14 are electrically connected in parallel with the variable capacitor 12 and the other switched capacitors 14. It will be appreciated however, that the present disclosure is not meant to be limited to such an embodiment or arrangement. Rather, in other exemplary embodiments, one or more switched capacitors 14 may be connected in series with the variable capacitor 12, in series with one or more other switched capacitors and in parallel with the variable capacitor 12, or in any other suitable arrangement, all of which remain within the spirit and scope of the present disclosure. Further, while in the illustrated embodiment the capacitor bank 10 includes three (3) switched capacitors 14 and the description below is primarily with respect to such an embodiment, in other exemplary embodiments that remain within the spirit and scope of the present disclosure, the capacitor bank 10 may include more or less than three (3) switched capacitors 14.

As will be described more fully below, the combination of the variable capacitor 12 and the switched capacitors 14 allow for continuous tuning of the capacitor bank 10 over a capacitance range that is greater than the predetermined capacitance range of the variable capacitor 12. In an exemplary embodiment, the tuning range may extend from the minimum capacitance value of the predetermined range, to a capacitance value that exceeds the maximum value of the predetermined range. Alternatively, in another exemplary embodiment, the tuning range of the capacitor bank 10 may extend from the maximum value of the predetermined range to a value below the minimum value of the predetermined range.

Figure 3:
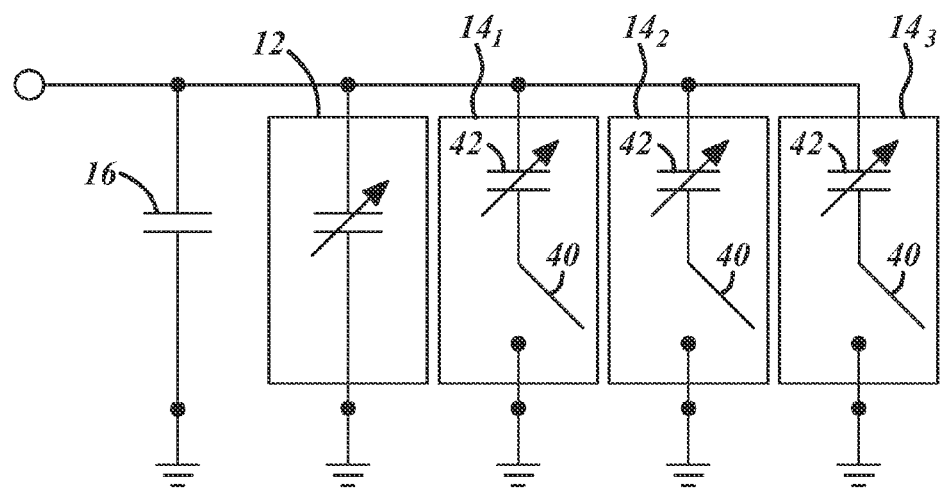
FIG. 3 is a schematic diagram of another exemplary embodiment of a wide range continuously tunable capacitor bank.

The switched capacitors 14 may take on a number of forms. For example, in the embodiment illustrated in FIG. 1, each of the switched capacitors 14 comprises the combination of a switch 36 and a fixed capacitor 38 (e.g., the switch 36 is connected in series with the fixed capacitor 38). In such an embodiment, the switch 36 may be an ohmic switch, a phase change switch, or any other suitable switch. In another exemplary embodiment, each of the switched capacitors 14 comprises a capacitive switch. In yet another exemplary embodiment, such as, for example, that illustrated in FIG. 3, each of the switched capacitors 14 may comprise the combination of a switch 40 (e.g., ohmic, phase change, etc.) and a variable capacitor 42 (e.g., the switch 40 is connected in series with the variable capacitor 42). In this embodiment, and as will be described in greater detail below, the variable capacitors 42 of the switched capacitors 14 serve to permit further continuous wide range tuning of the capacitor bank 10.

In an embodiment wherein the switched capacitors 14 comprise either a switch/fixed capacitor combination or a capacitive switch, each of the switched capacitors 14 has a first capacitance value corresponding to an open or un-actuated state of the switched capacitor 14 and a second capacitance value corresponding to a closed or actuated state of the switched capacitor 14. In an exemplary embodiment, the second capacitance value is larger than the first capacitance value, but is slightly lower than or equal to the maximum capacitance value of the variable capacitor 12. As will be illustrated in greater detail below, the reason the second value is lower than or equal to the maximum capacitance of the variable capacitor 12 is to allow for the continuous and smooth tuning of the capacitor bank 10 when the switched capacitors 14 are actuated. As with the predetermined capacitance or tuning range of the variable capacitor 12, it will be appreciated that the particular values for the first and second capacitance values of each of the switched capacitors 14 will be dependent upon a number of factors, including, for example, desired performance characteristics and design parameters or specifications of the capacitor bank 10 or an application in which the capacitor bank 10 is implemented. Therefore, the present disclosure is not meant to be limited to any particular values. However, for purposes of illustration, in an exemplary embodiment, the variable capacitor 12 has a range of 0.2-1.4 pF and each of the switched capacitors 14 has a first value of 0.2 pF and a second value of 1.3 pF. It will be appreciated by those of ordinary skill in the art that the aforementioned capacitance values are provided for exemplary purposes only and are not meant to be limiting in nature. Rather, in other embodiments that remain within the spirit and scope of the present disclosure, the variable capacitor 12 and the switched capacitors 14 may have any number of capacitance values.

Figure 4A:
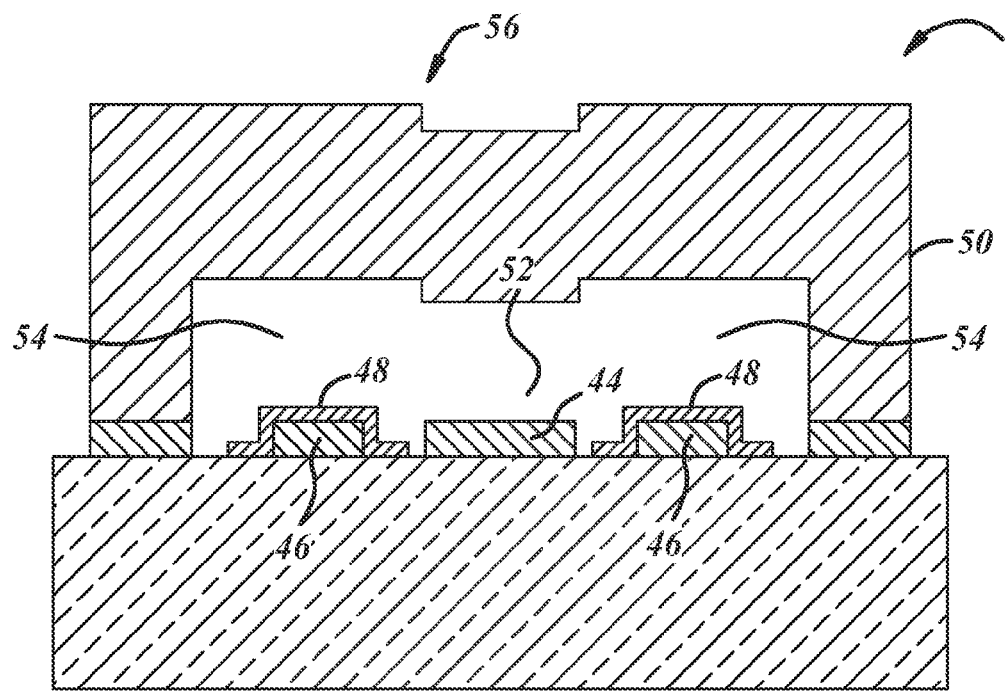
FIG. 4a is a cross-section view of an exemplary switch of an exemplary switched capacitor of the capacitor banks illustrated in FIGS. 1 and 3.
Figure 4B:
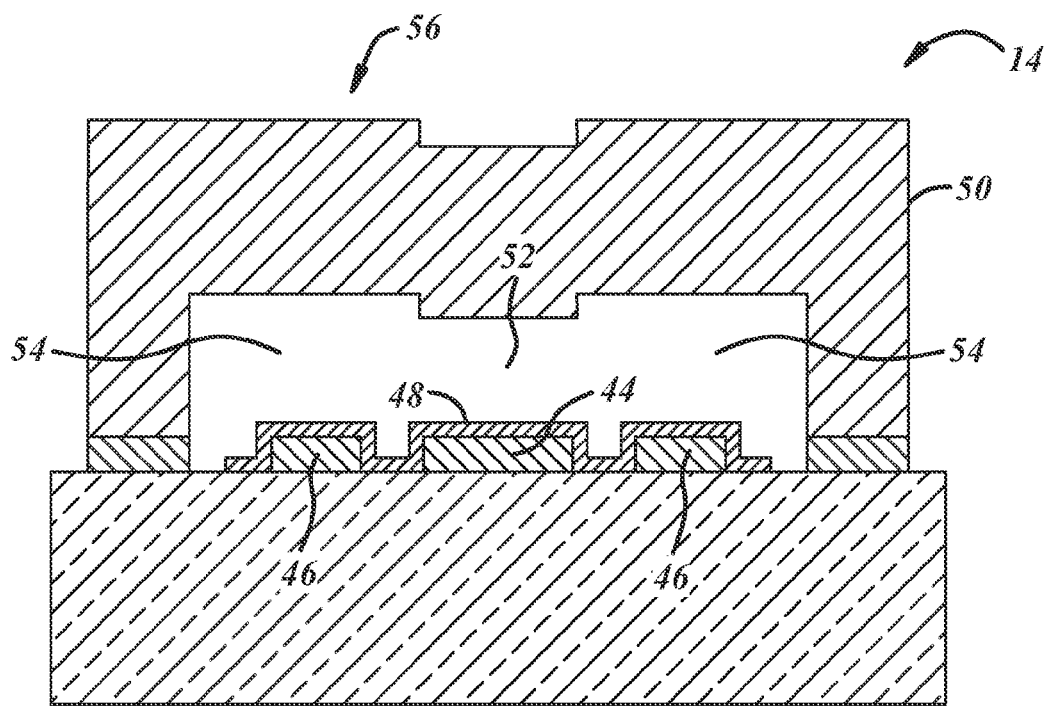
FIG. 4b is a cross-section view of an exemplary capacitive switch comprising an exemplary switched capacitor of the capacitor bank illustrated in FIG. 1.

As with the variable capacitor 12 described above, in an exemplary embodiment the switched capacitors 14 may comprise MEMS switched capacitors. In such an embodiment, and as illustrated in FIGS. 4a and 4b, each of the switched capacitors 14 may comprise a plurality of electrodes, including, for example, a RF or sense electrode 44 and a separate biasing or actuation electrode 46 (which, as illustrated in FIGS. 4a and 4b, may have a ring shape that surrounds the sense electrode 44), disposed on a substrate. The substrate may comprise a single- or multi-layer substrate, and in an exemplary embodiment, comprises a glass substrate (e.g., a Borosilicate glass substrate). In any event, the variable capacitor 12 and the switched capacitors 14 may be disposed on the same substrate to form an integrated capacitor bank. In an embodiment such as that illustrated in FIG. 4a wherein the switched capacitors 14 comprise the combination of a switch and a capacitor (not shown), the electrodes 44, 46 constitute part of the switch 36 (e.g., an ohmic switch) thereof. Alternatively, in an embodiment such as that illustrated in FIG. 4b wherein the switched capacitors 14 comprise capacitive switches, the sense electrode 44 constitutes an electrode of the capacitor formed when the capacitive switch is actuated. In such an embodiment, the sense electrode 44 has a layer of dielectric material 48 disposed thereon to create a capacitor when the capacitive switch is actuated. In either instance, the RF and actuation electrodes 44, 46 may be formed of a metallic material, such as, for example, gold. In an exemplary embodiment, the electrodes 44, 46 are formed of gold having a thickness of approximately 0.5 μm. Each of the sense electrode 44 (in the case where, as described above, the switched capacitor 14 is a capacitive switch) and actuation electrode 46 may also have a layer of dielectric material 48 formed thereon. The dielectric layer 48 may be formed of any number of dielectric materials and may have any number of thicknesses. In an exemplary embodiment, the dielectric layer 48 comprises a 500-1000 A° thick aluminum oxide ($Al_2O_3$) layer.

As with the variable capacitor 12 described above, the switch 36 of each switched capacitor 14 or the switched capacitor 14 itself (in the instance wherein it comprises a capacitive switch) may further comprise a top electrode or membrane 50, a portion of which is suspended over the electrodes 44, 46, as well as a capacitance sense gap 52 disposed between the top membrane 50 and the sense electrode 44, and an actuation gap 54 disposed between the top membrane 50 and the actuation electrode 46. In one exemplary embodiment, the top membrane 50 may comprise a bridge configuration, while in another exemplary embodiment, the top membrane 50 may comprise a cantilever configuration (not shown).

The top membrane 50 may be formed of a number of materials, such as for example, gold. In an exemplary embodiment, the top membrane 50 is formed of gold having a thickness of approximately 4 μm. As will be described below, the top membrane 50 has a flexible center portion 56 configured to move up and down to allow for the electrostatic actuation of the switched capacitor 14. As with the variable capacitor 12, the outer portions of the top membrane 50 are configured to be anchored in place and portions of the top membrane 50 disposed between the center, flexible portion and the outer, anchored portions are configured to serve as springs to help facilitate the movement of the center portion 56.

As briefly described above, each of the switched capacitors 14 (e.g., the switches 36 thereof or the capacitive switches, in the instance wherein the switched capacitors comprise capacitive switches) may be configured to be electrostatically actuated. More particularly, and as is well known in the art, each of the switched capacitors 14 may be electrostatically actuated in response to a sufficient bias voltage applied across the actuation gap 54 thereof between the actuation electrode 46 and the membrane 50. The application of a sufficient bias voltage (i.e., a voltage that is equal to or greater than the pull-in voltage) results in the creation of an attractive electrostatic force that, depending on the magnitude, may cause the flexible portion 56 of the membrane 50 to move within the sense gap 52 toward the sense electrode 44 and into contact with the surface of the electrode 44 (in an embodiment wherein the switched capacitor 14 comprises the combination of a switch 36 and a capacitor 38 and the electrode 44 forms part of the switch 36), or the dielectric material 48 disposed on the surface of the electrode 44 (in an embodiment wherein the switched capacitor 14 comprises a capacitive switch and the electrode 44 comprises an electrode of the capacitor formed when the capacitive switch is actuated), thereby resulting in the actuation of the switched capacitor 14. Conversely, when the electrostatic force is removed or at least sufficiently lessened (e.g., the applied bias voltage is reduced to zero or at least to a magnitude below the hold-down voltage that is required to keep the membrane 50 in contact with the electrode 44 or dielectric 48), the springs of the top membrane 50 cause the flexible portion 56 to move away from the sense electrode 44, thereby de-actuating the switched capacitor 14. Accordingly, by selectively applying and removing a sufficient bias voltage (e.g., equal to or greater than the pull-in voltage) to the actuation electrodes 46 of the switched capacitors 14, the switched capacitors 14 may be selectively actuated and/or de-actuated. In an exemplary embodiment, a digital signal may be used to actuate the switched capacitors 14. For example, a digital high signal (e.g., 40 VDC) applied to the actuation electrode 46 may cause the switched capacitor 14 to be actuated, while no signal or a digital low signal (e.g., 0 VDC) may either de-actuate the switched capacitor 14 or at least not cause the switched capacitor 14 to be actuated, as described above.

For a number of reasons, the respective sense and actuation gaps 52, 54 may be sized so that the sense gap 52 is smaller than the actuation gap 54, and that there is a particular ratio between the sizes of the gaps. In an exemplary embodiment, this ratio (actuation:sense) is approximately 4:3.

In an embodiment wherein the switched capacitors 14 comprise a combination of a switch 36 and a fixed capacitor 38, the capacitor 38 may comprise a metal-insulator-metal (MIM) capacitor formed by metal and insulation layers on the substrate, and may be disposed on the same substrate as those components described above (e.g., the switch 36 and the variable capacitor 12). Similarly, in an embodiment wherein the switched capacitors 14 comprise a combination of a switch 40 and a variable capacitor 42, the capacitor 42 may also be disposed on the same substrate as those components described above, and may comprise a variable capacitor such as the variable capacitor 12 described above. In either instance, the capacitors 38, 42 may be electrically connected to the switches corresponding thereto and other components, if appropriate, by interconnects on the substrate. Similarly, the variable capacitor 12, the switched capacitors 14, and, if applicable, the fixed capacitor 16, may be electrically connected together, as appropriate, by interconnects on the substrate.

It will be appreciated by those of ordinary skill in the art that while certain materials (gold and aluminum dioxide) and dimensions of both the materials and the components of the switched capacitors 14 are specifically provided above, the present disclosure is not meant to be limited either to those materials or dimensions. Rather, components having suitable dimensions or being formed of suitable materials other than those described above, and materials having suitable dimensions other than those identified above, remain within the spirit and scope of the present disclosure.

In an exemplary embodiment, and as briefly described above, the capacitor bank 10 may further comprise a fixed capacitor 16. As illustrated in FIG. 1, the capacitor 16 is electrically connected in circuit with the variable capacitor 12 and the switched capacitors 14. In an exemplary embodiment, the capacitor 16 is connected in parallel with the variable capacitor 12 and the switched capacitors 14. The fixed capacitor 16 may comprise a MIM capacitor, the particular value of which will be dependent upon a number of factors, including, for example, desired performance characteristics and design parameters or specifications of the capacitor bank 10 or an application in which it is implemented. Therefore, the present disclosure is not meant to be limited to any particular value. However, for purposes of illustration, in an exemplary embodiment, the capacitor 16 has a capacitance of 1.5 pF.

As briefly described above, the combination of the variable capacitor 12 and the switched capacitors 14 allow for the continuous wide range tuning of the capacitor bank 10. More particularly, in an embodiment such as that illustrated in FIG. 1, and as will be described in greater detail below when a particular application or implementation of the capacitor bank 10 is described, because the variable capacitor 12, the switched capacitors 14, and the fixed capacitor 16 are electrically connected to each other in parallel in this particular embodiment, the capacitances thereof are additive. Accordingly, by adjusting the value of the variable capacitor 12 within the corresponding tuning range and selectively actuating one or more of the switched capacitors 14, the capacitor bank 10 may be continuously tuned over a capacitance range that is greater than the capacitance range of the variable capacitor 12 (or the capacitance range defined by the combination of the capacitance range of the variable capacitor 12 and the fixed capacitor 16, as the case may be). For example, assume for purposes of illustration only that the capacitor bank 10 comprises the variable capacitor 12, three (3) switched capacitors 14, and the fixed capacitor 16, and that each component has the capacitance range/values set forth in Table I below.

TABLE I

| Component | Range/Value |
| --- | --- |
| Variable Capacitor | 0.2-1.4 pF |
| Switched Capacitor | 0.2 pF (unactuated) |
|  | 1.3 pF (actuated) |
| Fixed Capacitor | 1.5 pF |

If the desired capacitance of the capacitor bank 10 is between 2.3 pF and 3.5 pF, the capacitance value of the variable capacitor 12 can be adjusted (i.e., by adjusting the bias voltage applied thereto) to achieve the desired value without actuating any of the switched capacitors 14. More particularly, the fixed capacitor 16 has a value of 1.5 pF, each of the un-actuated switched capacitors 14 have an un-actuated value of 0.2 pF, and the variable capacitor 12 has a capacitance range of 0.2-1.4 pF. Accordingly, the summing of these values together results in a range of 2.3-3.5 pF.

However, if the desired capacitance of the capacitor bank 10 is between 3.4 pF and 4.6 pF, a combination of the adjustment of the variable capacitor 12 and the actuation of a first switched capacitor $14_1$ may be used to achieve the desired value. More particularly, the variable capacitor 12 may be adjusted from 0.2 to 1.3 pF (e.g., from its minimum value to the maximum capacitance value of the switched capacitors 14) by adjusting the bias voltage applied to the variable capacitor 12, and then the first switched capacitor $14_1$ may be actuated (e.g., by applying a digital actuation signal) for further tuning. Simultaneous with the actuation of the first switched capacitor $14_1$, the variable capacitor 12 is de-tuned to its initial value (0.2 pF) (e.g., by reducing the bias voltage to 0 VDC). The reason for this is that if the variable capacitor 12 is tuned to, for example, a value of 1.3 pF and is not de-tuned simultaneously with the actuation of the first switched capacitor $14_1$, the capacitance value of the capacitor bank 10 will jump from 3.4 pF to 4.5 pF (i.e., 1.3 pF from the variable capacitor 12, 0.2 pF from each of the two un-actuated switched capacitors 14, 1.3 pF from the actuated switched capacitor 14, and 1.5 pF from the fixed capacitor 16 totals 4.5 pF), and thus the tuning will not be continuous and smooth. When the actuation of the first switched capacitor $14_1$ and the de-tuning of the variable capacitor 12 is simultaneous, the capacitance of the capacitor bank 10 will stay at 3.4 pF (i.e., 0.2 pF from the variable capacitor 12, 0.2 pF from each of the two un-actuated switched capacitors 14, 1.3 pF from the actuated switched capacitor 14, and 1.5 pF from the fixed capacitor 16 totals 3.4 pF) and can then be tuned further by adjusting the value of the variable capacitor 12 to acquire a desired capacitance value within the range of 3.4-4.6 pF. It is for this same reason that the second or actuated capacitance values of the switched capacitors 14 are slightly lower than or equal to the maximum capacitance value of the variable capacitor 12.

Similar to the above, if the desired capacitance of the capacitor bank 10 is between 4.5 pF and 5.7 pF, a combination of the adjustment of the variable capacitor 12 and the actuation of the first and second switched capacitors $14_1$, $14_2$ may be used to achieve the desired value. More particularly, once the first switched capacitor $14_1$ is actuated as described above, the variable capacitor 12 may once again be adjusted to a particular value (e.g., the maximum value of the switched capacitors 14) and then the second switched capacitor $14_2$ may be actuated. As described above, to avoid an undesirable jump in the capacitance value of the capacitor bank 10, the variable capacitor 12 is simultaneously de-tuned to its initial value upon the actuation of the second switched capacitor $14_2$. When the first and second switched capacitors $14_1$, $14_2$ are actuated and the variable capacitor is de-tuned to its initial value, the capacitance of the capacitor bank is 4.5 pF. If necessary, the variable capacitor 12 may then be adjusted to acquire a desired capacitance value within the range of 4.5-5.7 pF.

Finally, if the desired capacitance of the capacitor bank 10 is between 5.6 and 6.8, a combination of the adjustment of the variable capacitor 12 and the actuation of the first, second, and third switched capacitors $14_1$-$14_3$ may be used to achieve the desired value in a similar manner to that described above. Accordingly, the description will not be repeated here.

It will be appreciated by those of ordinary skill in the art that while the description above is limited to the continuous tuning of the capacitor bank 10 upwards (i.e., to higher capacitance values within the tuning range of the capacitor bank 10), a similar process in which the capacitance value of the variable capacitor 12 is adjusted and the switched capacitors 14 are selectively actuated and de-actuated may be used to continuously tune the capacitor bank 10 downwards (i.e., to lower capacitance values within the tuning range of the capacitor bank 10).

In an embodiment wherein the switched capacitors 14 comprise the combination of a switch 40 and variable capacitor 42 (as opposed to a switch/fixed capacitor combination or a capacitive switch), each of variable capacitors 42 of the switched capacitors 14 has a predetermined tuning range defined by a minimum capacitance value and a maximum capacitance value. The minimum and maximum values defining the tuning range of each variable capacitor 42 may be the same as, or different than, the minimum/maximum values defining the tuning range(s) of the other variable capacitors 42. In an exemplary embodiment, the capacitance range for each variable capacitor 42 is dependent upon the capacitance range of the preceding variable capacitors 12, 42 in the capacitor bank 10. For example, in an embodiment having two switched capacitors 14, the minimum/maximum values defining the capacitance range of the variable capacitor 42 of the first switched capacitor $14_1$ may be the same as those defining the tuning range of the variable capacitor 12, while minimum/maximum values defining the range of the variable capacitor 42 of the second switched capacitor $14_2$ may be double those defining the range of the variable capacitor 42 of the first switched capacitor $14_1$ (i.e., the minimum/maximum values defining the ranges of the variable capacitor 12 and the variable capacitor 42 of the first switched capacitor 14 may be added together with the result being the minimum/maximum values of the range of the variable capacitor 42 of the second switched capacitor $14_2$). Similarly, in an embodiment wherein the capacitor bank 10 has three switched capacitors 14, the minimum/maximum values defining the range of the variable capacitor 42 of the switched capacitor $14_3$ may be double those defining the range of the variable capacitor 42 of the switched capacitor $14_2$, and so on and so forth.

In any event, it will be appreciated that the particular values of the minimum/maximum values defining the respective tuning ranges of the variable capacitors 42 will be dependent upon a number of factors, including, for example, desired performance characteristics and design parameters or specifications of the capacitor bank 10 or an application in which the capacitor bank 10 is implemented. Therefore, the present disclosure is not meant to be limited to any particular values or ranges. However, for purposes of illustration, in an exemplary embodiment, the variable capacitor 12 has a range of 0.5-1.0 pF, the variable capacitor 42 of a first switched capacitor $14_1$ has a range of 0.5-1.0 pF, the variable capacitor 42 of a second switched capacitor $14_2$ has a range of 1.0-2.0 pF, and the variable capacitor 42 of a third switched capacitor $14_3$ has a range of 2.0-4.0 pF. It will be appreciated by those of ordinary skill in the art that the aforementioned capacitance ranges and values defining those ranges are provided for exemplary purposes only and are not meant to be limiting in nature. Rather, in other embodiments that remain within the spirit and scope of the present disclosure, the variable capacitor 12 and the variable capacitors 42 of the switched capacitors 14 may have any number of capacitance or tuning ranges.

As with the embodiment described above, the combination of the variable capacitor 12 and the switched capacitors 14 allow for the continuous wide range tuning of the capacitor bank 10. More particularly, in the embodiment illustrated in FIG. 3, because the variable capacitor 12 and the switched capacitors 14 are electrically connected to each other in parallel, the capacitances thereof are additive. Accordingly, by adjusting the value of the variable capacitor 12 within the corresponding tuning range and selectively actuating one or more of the switched capacitors 14 and then adjusting the value of the variable capacitor 42 thereof, the capacitor bank 10 may be continuously tuned over a wide capacitance range.

For example, assume, for purposes of illustration only, that the capacitor bank 10 comprises the variable capacitor 12 and two (2) switched capacitors 14, and that each component has the capacitance range/values set forth in Table II below.

TABLE II

| Component | Range/Value |
|---|---|
| Variable Capacitor | 0.5-1.0 pF |
| Variable Capacitor of First Switched Capacitor | 0.5-1.0 pF |
| Variable Capacitor of Second Switched Capacitor | 1.0-2.0 pF |

If the desired capacitance of the capacitor bank 10 is between 0.5 and 1.0 pF, the capacitance value of the variable capacitor 12 can be adjusted to achieve the desired value without actuating any of the switched capacitors 14.

However, if the desired capacitance of the capacitor bank 10 is between 1.0 pF and 2.0 pF, a combination of the adjustment of the variable capacitor 12 and the actuation of a first switched capacitor $14_1$ (and possibly the adjustment of the variable capacitor 42 thereof) may be used to achieve the desired value. More particularly, the variable capacitor 12 may adjusted to its maximum value (e.g., 1 pF) and then the first switched capacitor $14_1$ may be actuated. For the same reasons described above, simultaneous with the actuation of the first switched capacitor $14_1$, the variable capacitor 12 is de-tuned to its initial value (0.5 pF). When the actuation of the first switched capacitor $14_1$ and the de-tuning of the variable capacitor 12 are simultaneous, the capacitance of the capacitor bank 10 will remain at 1.0 pF (i.e., 0.5 pF from the variable capacitor 12 and 0.5 pF from the switched capacitor $14_1$). The value of one or both of the variable capacitors 12, 42 may then be adjusted within their respective ranges to acquire a desired capacitance value within the range of 1.0-2.0 pF.

Similar to the above, if the desired capacitance of the capacitor bank 10 is between 2.0 pF and 4.0 pF, a combination of the adjustment of the variable capacitor 12 and the actuation of the first and second switched capacitors $14_1$ and $14_2$ (and possibly the adjustment of the variable capacitors 42 thereof) may be used to achieve the desired value. More particularly, once the first switch $14_1$ is actuated as described above, the variable capacitors 12, 42 may be adjusted to their maximum values, thereby resulting in a total capacitance of 2.0 pF (i.e., 1.0 pF from each of the variable capacitors 12, 42). At that point, the second switched capacitor $14_2$ may be actuated. Simultaneous with the actuation of the second switched capacitor $14_2$, and for the same reasons described elsewhere above, the variable capacitor 12 and the variable capacitor 42 of the first switched capacitor $14_1$ are de-tuned to their initial values (0.5 pF). When the actuation of the second switched capacitor $14_2$ and the de-tuning of both the variable capacitor 12 and variable capacitor 42 of the first switched capacitor $14_1$ are simultaneous, the capacitance of the capacitor bank 10 will remain at 2.0 pF (i.e., 0.5 pF from each of the variable capacitor 12 and the first switched capacitor $14_1$, and 1.0 pF from the second switched capacitor $14_2$). The values of one or all of the variable capacitors 12, 42 may then be adjusted within their respective ranges to acquire a desired capacitance value within the range of 2.0-4.0 pF.

Accordingly, as illustrated above, by adjusting the capacitance value of the variable capacitor 12 and either selectively actuating (or de-actuating) one or more of the switched capacitors 14, or selectively actuating (or de-actuating) one or more of the switched capacitors 14 and then adjusting the capacitance value(s) of the variable capacitor(s) 42 thereof, the capacitor bank 10 may be continuously tuned over a wide range of capacitances that exceeds the range of the variable capacitor 12, while also meeting or satisfying high performance standards.

It will be appreciated by those of ordinary skill in the art that while the description above is limited to the continuous tuning of the capacitor bank 10 upwards (i.e., to higher capacitance values within the tuning range of the capacitor bank 10), a similar process in which the capacitance value of the variable capacitor 12 is adjusted, the switched capacitors 14 are selectively actuated and de-actuated, and the capacitance values of the variable capacitors of the actuated switched capacitors 14 are adjusted, may be used to continuously tune the capacitor bank 10 downwards (i.e., to lower capacitance values within the tuning range of the capacitor bank 10).

It will be further appreciated that while the examples and description above are directed to an embodiment wherein the tuning of the capacitor bank 10 is continuous and smooth, the capacitor bank 10 may also be tuned in a non-continuous manner. More particularly, by adjusting the value of the variable capacitor 12 and selectively actuating the switches 40 of the switched capacitors 14 and possibly adjusting the values of the variable capacitors 42 thereof, the capacitor bank 10 can be tuned to any capacitance within the wide tunable capacitance range of the capacitor bank 10 either continuously or by jumping or hopping from one capacitance value to another within the range.

Figure 5:
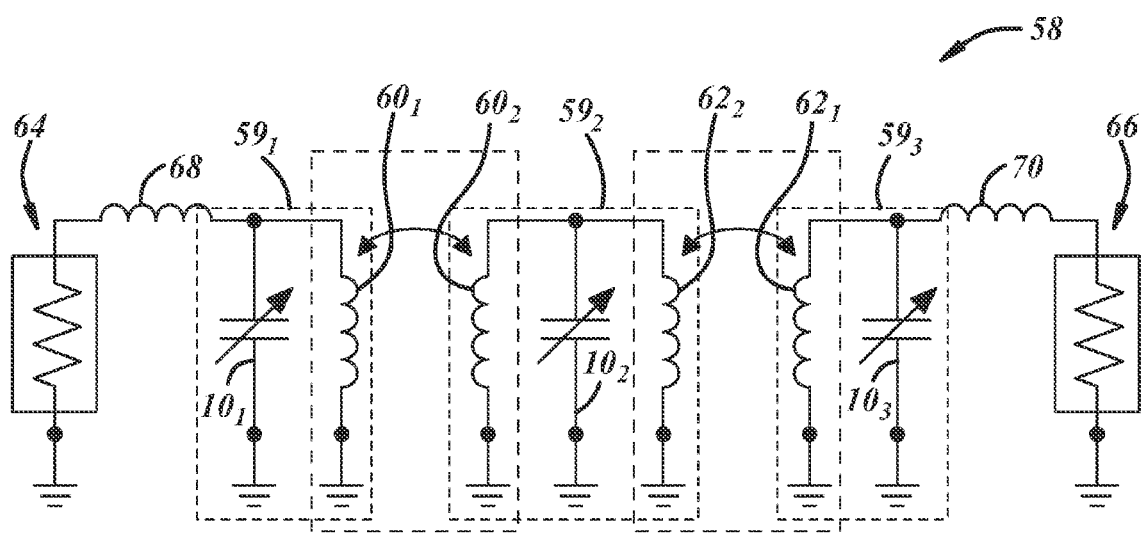
FIG. 5 is a schematic diagram of an exemplary wide range continuously tunable RF filter.

As briefly described above, the capacitor bank 10 may lend itself to implementation in a number of applications. One such application is a RF filter that is tunable over a wide range of frequencies (e.g., 600-1000 MHz, for example). More particularly, in such an application, one or more tunable capacitor banks 10 may be employed in combination with other elements (e.g., inductive elements such as, for example, one or more inductors) to form a continuously tunable resonator circuit. One or more of the resonator circuits may, in turn, be combined to form, at least in part, a lumped RF bandpass filter. For example, FIG. 5 illustrates a third-order continuously tunable Chebyshev RF filter 58 comprising three (3) continuously tunable resonator circuits 59 (i.e., resonator circuits $59_1$, $59_2$, $59_3$), each of which comprises a respective capacitor bank 10 (i.e., capacitor banks $10_1$, $10_2$, $10_3$). Each of the resonator circuits 59 may be inductively or capacitively coupled to at least one other resonator circuit 59. For instance, in the illustrated embodiment, the resonator circuit $59_1$ is inductively coupled with the resonator circuit $59_2$ by a pair of mutually coupled inductive elements (e.g., inductors $60_1$, $60_2$). Similarly, the resonator circuit $59_2$ is inductively coupled with the resonator circuit $10_3$ by a second pair of mutually coupled inductive elements (e.g., inductors $62_1$, $62_2$). In operation, and as will be described below, by tuning the capacitor banks 10 of the resonator circuits 59, the filter 58 may be tuned to a particular frequency band or a specific frequency within a given wide frequency band. Because, as described above, the capacitor banks 10 have such wide tuning ranges, the filter 58 may also have a wide frequency range such that it may be tuned to a frequency or frequency band within a much wider frequency range than conventional filters.

In addition to the components described above, in an exemplary embodiment, the filter 58 further comprises a first or input port 64, a second or output port 66, a first matching inductive element (e.g., inductor 68) electrically connected between the input port 64 and the resonator circuit $59_1$, and a second matching inductive element (e.g., inductor 70) electrically connected between the output port 66 and the resonator circuit $59_3$. Mutually coupled inductive elements and inductive matching are utilized to provide wider frequency band matching and to avoid complicated tuning control of the filter 58.

Figure 6:
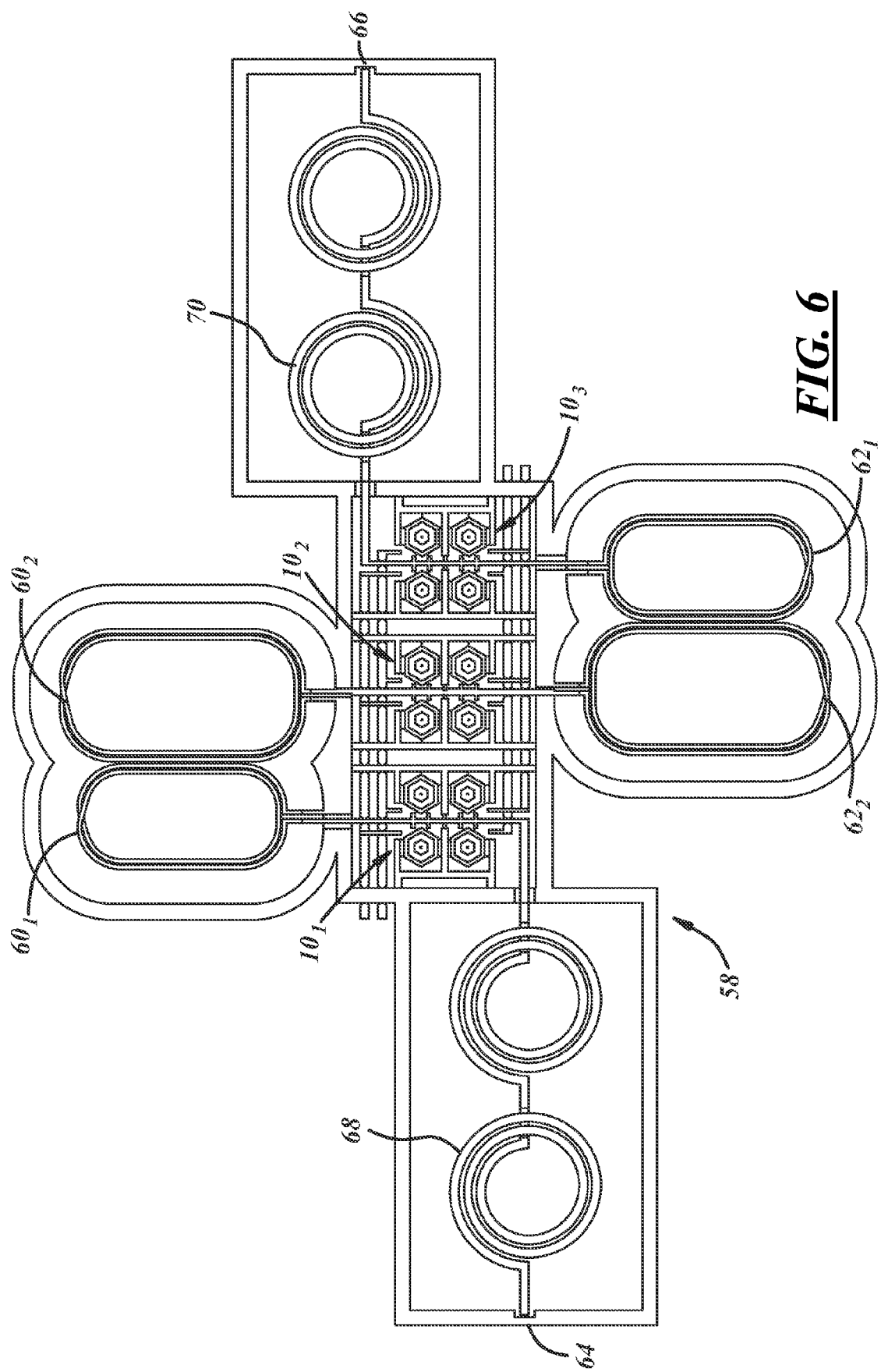
FIG. 6 is a top plan view of one exemplary implementation of the filter illustrated in FIG. 5.

As with the capacitor bank 10, the filter 58 and each of the resonator circuits 59 and other components thereof may be fabricated in a number of ways, including, for example, using a surface micro-fabrication technology such as MEMS technology. In such an embodiment, the filter 58, or least certain components thereof, may be constructed as an integrated system formed on a single substrate or wafer to form a system-on-a-chip. FIG. 6 is a top plan view of an exemplary embodiment of the filter 58 in the form of a fully-integrated RF MEMS tunable filter. As illustrated in FIG. 6, the filter 58 comprises three capacitor banks 10 (each corresponding to a respective resonator circuit), two pairs of inductors (i.e., inductors $60_1$, $60_2$ and $62_1$, $62_2$) that function to inductively couple respective resonator circuits together, and the matching inductors (i.e., inductors 68, 70). In such an embodiment, electrical interconnects on the substrate may serve to connect those components that are to be electrically connected to each other. Further, the actuation electrodes 20 of the variable capacitors 12 of the capacitor banks 10 are tied together to a single bias or actuation line (best shown in FIG. 7) to allow for the simultaneous tuning of the variable capacitors 12, while corresponding switched capacitors 14 of each capacitor bank 10 are also tied to respective bias or actuation lines (best shown in FIG. 7) to allow for the simultaneous actuation of corresponding switched capacitors. More particularly, the actuation electrodes 20 of the first switched capacitors $14_1$ of the capacitor banks 10 are tied together, the actuation electrodes 20 of the second switched capacitors $14_2$ of the capacitor banks 10 are tied together, and the actuation electrodes 20 of the third switched capacitors $14_3$ of the capacitor banks 10 are tied together. As a result, in an exemplary embodiment, only one bias or actuation line is required for the variable capacitors 12, and a number of bias or actuation lines equal to the number of switched capacitors 14 in one capacitor bank 10 are required for the switched capacitors (e.g., three bias or actuation lines where the capacitor banks 10 each include three switched capacitors) to tune the filter 58.

As was described above, it will be appreciated that specific values for the various components of the resonator circuits 59 and other various components (e.g., inductors) of the filter 58 will be dependent upon a number of factors, including, for example, desired performance characteristics and design parameters or specifications of the filter 58, such as, for example, those relating to tuning range, tuning speed, temperature stability, power consumption and handling, insertion loss, and shape factor, to name a few. Therefore, the present disclosure is not meant to be limited to any particular values or ranges. For purposes of illustration, Table III identifies a number of exemplary target specifications for a particular filter.

TABLE III

| Characteristic | Target Value |
| --- | --- |
| Center Frequency Range | 600 MHz~1000 MHz |
| Insertion Loss | <4 dB at $\omega_c$ |
| 3 dB-Bandwidth | 12~16% of $\omega_c$ |
| Shape Factor ($BW_{30\,dB}/BW_{3\,dB}$) | <4 |
| Impedance | 50 Ω |
| Tuning Voltage | <50 VDC |

Based on these criteria, Table IV sets forth the values and ranges of the various components of the filter 58 that serve to meet most, if not all, of the specifications and parameters identified in Table III.

TABLE IV

| Component | Range/Value |
| --- | --- |
| Matching Inductors 68, 70 | 32.0 nH |
| Mutually Coupled Inductor $60_1, 62_1$ | 16.4 nH |
| Mutually Coupled Inductor $60_2, 62_2$ | 22.6 nH |
| Tunable Capacitor Bank 10 | 2.3-6.8 pF |
| Fixed Capacitor 16 | 1.5 pF |
| Variable Capacitor 12 | 0.2-1.4 pF |
| Switched Capacitor 14 | 0.2 pF (un-actuated) |
| | 1.3 pF (actuated) |

Using the component values set forth in Table IV above, the operation of the filter 58 will now be described. As briefly described above, the filter 58 may be tuned to a particular frequency or frequency band by tuning the capacitance of the capacitor banks 10 of the resonator circuits 59. How the capacitor banks 10 are tuned depends on the particular frequency that is desired. Accordingly, in an exemplary embodiment, an arrangement such as that illustrated in FIG. 7 may be utilized to control the tuning of the capacitor banks 10, and therefore, the filter 58. More particularly, in an exemplary embodiment, a control unit 72 comprising a controller 74 and a power supply 76 is configured and operable to receive an input representative of a desired frequency or frequency band from, for example, a control unit input 78. Responsive to the received input, the controller 74 is configured to determine the required capacitance of the capacitor banks 10 needed to achieve the desired frequency. This may be accomplished by, for example, looking up the desired frequency in a data structure (e.g., look-up table), such as, for example, that set forth in Table V below, that may be stored in or on a memory 80 or other storage device that is part of or accessible by the controller 74.

TABLE V

| Frequency Band | Capacitance |
| --- | --- |
| 811-1000 MHz | 2.3-3.5 pF |
| 707-824 MHz | 3.4-4.6 pF |
| 635-715 MHz | 4.5-5.7 pF |
| 582-640 MHz | 5.6-6.8 pF |

Figure 7:
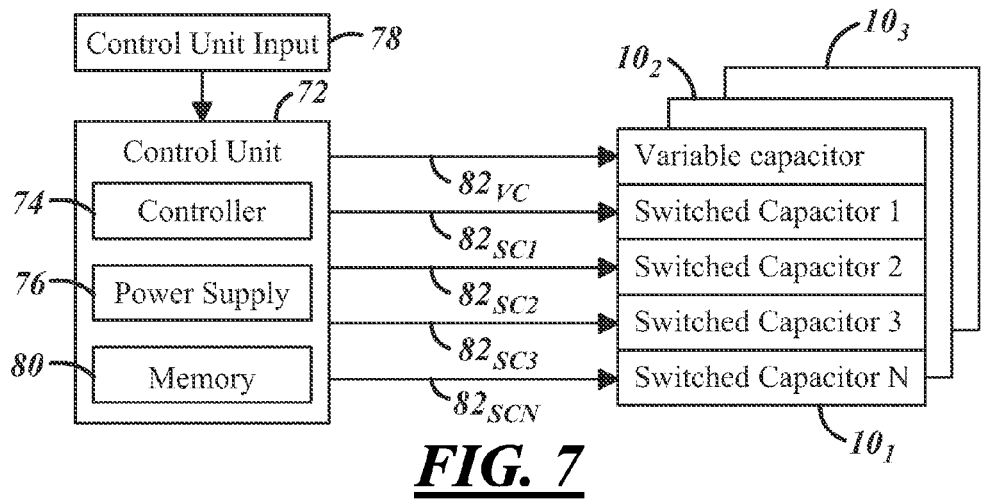
FIG. 7 is a schematic and block diagram illustrating an exemplary arrangement for controlling the tuning of the filter illustrated in FIG. 5.

Once the required capacitance is determined, the controller 74 is operable to tune the filter 58 to the desired frequency by appropriately tuning the capacitor banks 10. As described above with respect to the capacitor bank 10, this may comprise adjusting the variable capacitors 12 of the capacitor banks 10 and controlling the state of the switched capacitors 14 thereof, as necessary. More particularly, in an exemplary embodiment, the controller 74 is configured to adjust the bias voltage applied by the power supply 76 to the variable capacitors 12 of each capacitor bank 10, which in an exemplary embodiment entails adjusting bias voltage between 0-40 VDC, and to apply either a digital high (e.g., 40 VDC) or a digital low (e.g., 0 VDC) to the switched capacitors 14 to selectively control which, if any, switched capacitors 14 are actuated. As illustrated in FIG. 7, a plurality of bias lines 82 (i.e., bias lines $82_{VC}$, $82_{SC1}$, $82_{SC2}$, $82_{SC3}$, $82_{SCN}$) may electrically connect the control unit 72 and the capacitor banks 10 to facilitate this control.

Accordingly, in exemplary embodiment, the controller 74 may include any type of suitable electronic processor (e.g., a microprocessor, a microcontroller, an application specific integrated circuit (ASIC), etc.) that executes instructions for software, firmware, programs, algorithms, scripts, etc., and is not limited to any one type of component or device. The control unit input 78 may comprise any number inputs, such as, for example, a RF power meters, feedback from a component of the control unit 72, or any number of user interfaces known in the art, such as, for example, push buttons, switches, knobs, touch screens, keypads, keyboards, graphical user interfaces, and any other device suitable configured to allow the input or selection representative of a desired frequency or frequency band. Further, the memory device 80 may include any type of suitable electronic memory means and may store a variety of data and information. This includes, for example: the data structures correlating frequency with capacitance; software, firmware, programs, algorithms, scripts, and other electronic instructions; etc.

Once the requisite capacitor bank capacitance value has been determined, the capacitor banks 10 may tuned to that capacitance value in the manner described in detail above. For example, in an exemplary embodiment, and using the data structure of Table V, if the desired frequency is within the frequency band of 811-1000 MHz, the capacitance of the capacitor banks 10 is adjusted to be within the capacitance range of 2.3-3.5 pF. As described above, the capacitance value of the variable capacitors 12 can be adjusted to achieve this capacitance value without having to actuate any of the switched capacitors 14. Accordingly, the controller 74 can adjust the capacitance value of the variable capacitors 12, and transmit a digital low signal to all of the switched capacitors 14 to keep them in an un-actuated state.

However, if the desired frequency is within the frequency band of 707-824 MHz, the capacitance value of each capacitor bank 10 must be within the capacitance range of 3.4-4.6 pF, and therefore, a combination of the adjustment of the variable capacitors 12 and the actuation of a first switched capacitor $14_1$ of the capacitor banks 10 may be used to achieve the required capacitance. More particularly, and as described above, the variable capacitors 12 may be adjusted to the maximum value of the switched capacitors 14 and then the first switched capacitors $14_1$ may be actuated. Simultaneous with the actuation of the first switched capacitors $14_1$, and for the reasons described above, each of the variable capacitors 12 is de-tuned to its initial value. The variable capacitors 12 may then be adjusted again to acquire the required capacitance value.

Similar to the above, if the desired frequency is within the frequency band of 635-715 MHz, the capacitance value of each capacitor bank 10 must be within the capacitance range of 4.5-5.7 pF, and therefore, a combination of the adjustment of the variable capacitors 12 and the actuation of a pair of switched capacitors 14 of each capacitor bank 10 may be used to achieve the required capacitance. More particularly, once the first switched capacitors $14_1$ are actuated as described above, the variable capacitors 12 may once again be adjusted to the maximum value of the switched capacitors 14 and then the second switched capacitors $14_2$ may be actuated. Again, and for reasons described above, the variable capacitors 12 are simultaneously de-tuned to their initial values upon the actuation of the second switched capacitors $14_2$. The variable capacitors 12 may then be adjusted again to acquire the required capacitance value.

Finally, if the desired frequency is within the frequency band of 582-640 MHz, the capacitance value of each capacitor bank 10 must be within the capacitance range of 5.6-6.8 pF, and therefore, a combination of the adjustment of the variable capacitors 12 and the actuation of all three switched capacitors $14_1$-$14_3$ of each capacitor bank 10 may be used to achieve the required capacitance in a similar manner to that described above. Accordingly, the description will not be repeated here.

Accordingly, by incorporating wide range continuously tunable capacitor banks 10 in the filter 58, the filter 58 may be continuously tuned over a wide range of frequencies while also meeting or satisfying high performance standards.

As described above, some or all of the components of the filter 58 may be fabricated using a surface micro-fabrication technology such as MEMS technology. For example, the variable capacitor 12, the switched capacitors 14, and/or the fixed capacitor 16 of the capacitor bank 10 may be MEMS components. When each of the aforementioned components are MEMS components, they may be combined to form a MEMS capacitor bank 10. Similarly, each pair of coupling inductors 60, 62 and/or matching inductors 68, 70 may also be fabricated using MEMS technology to form the resonator circuits 59 and the RF filter 58 as an integrated MEMS resonator circuit and filter, respectively, disposed on a single substrate or wafer (i.e., an integrated system on a chip). It will be appreciated that while the description above has primarily been directed to an embodiment wherein the aforementioned components are MEMS components, those of ordinary skill in the art will appreciated that some or all of those components may comprise components other than MEMS components, and may be fabricated using technologies other than MEMS technology. Accordingly, the present disclosure is not meant to be limited to any one particular type of component or fabrication technology.

Figure 8:
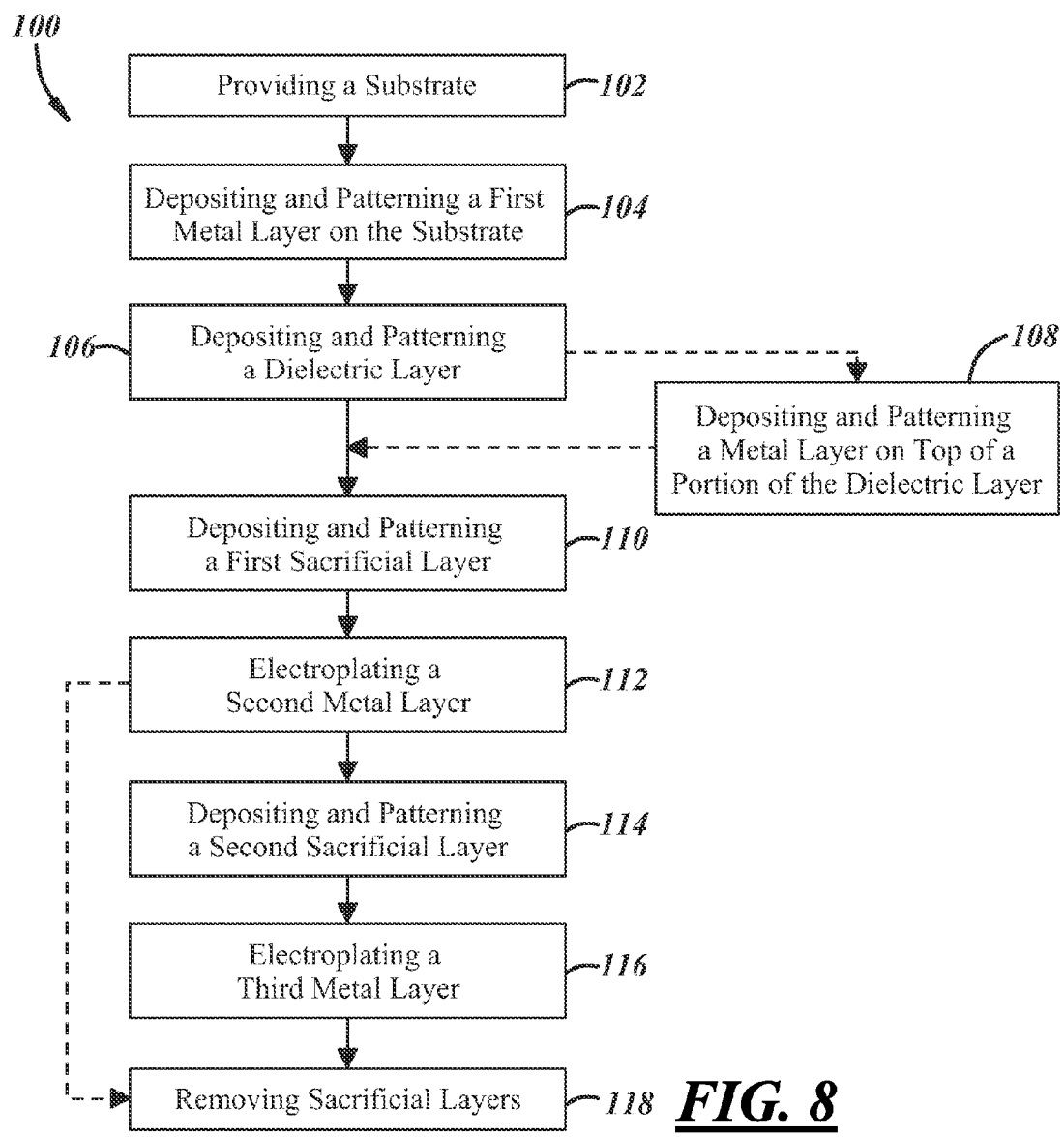
FIG. 8 is a flow diagram illustrating an exemplary method of fabricating a micro-electromechanical system (MEMS) that comprises a plurality of passive components.
Figure 9A:
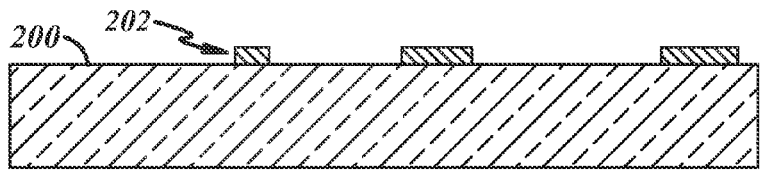
FIGS. 9a-9h are diagrams illustrating the fabrication methodology depicted in FIG. 8.
Figure 9B:
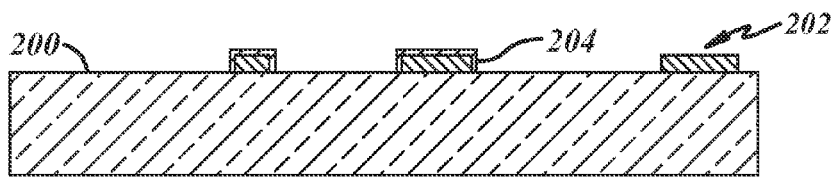
Figure 9C:
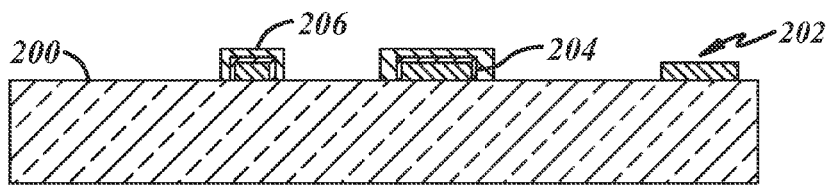
Figure 9D:
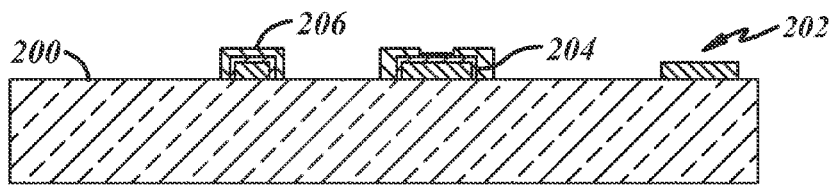
Figure 9E:
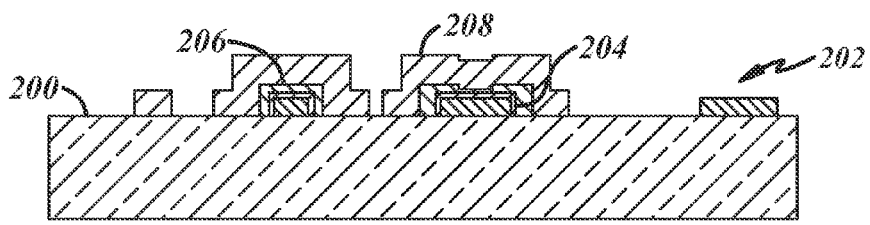
Figure 9F:
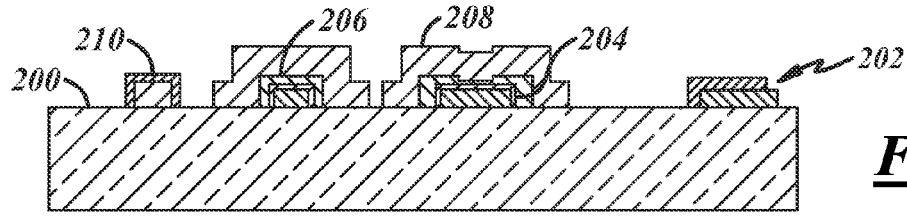
Figure 9G:
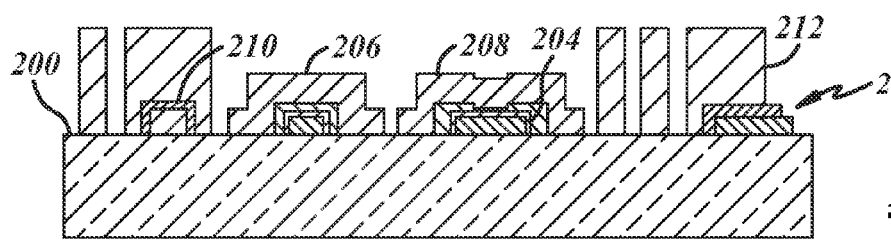
Figure 9H:
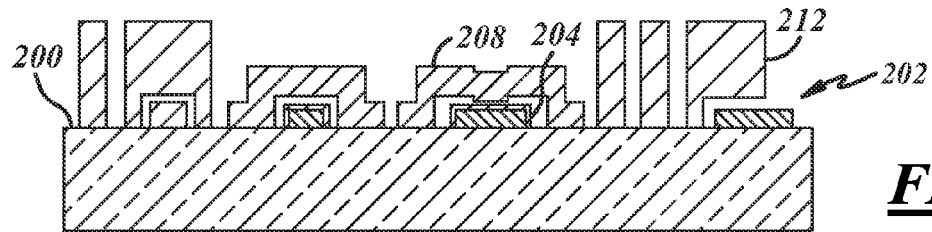

However, in an embodiment wherein components such as those described above are MEMS components, they may be fabricated using the methodology illustrated in FIGS. 8-9h.

Accordingly, another aspect of this disclosure relates to a method 100 of fabricating a MEMS comprising one or more passive electrical components, including but not limited to, those components described in detail above. In an exemplary embodiment wherein the MEMS includes multiple passive electrical components, the multiple components are fabricated simultaneously.

In an exemplary embodiment, the method 100 comprises a step 102 of providing a substrate, such as, for example, the substrate 200 shown in FIG. 9a. As described elsewhere above, the substrate may comprise a single- or multi-layer substrate. In an exemplary embodiment, the substrate 200 comprises a glass substrate, such as, for example, a Borosilicate glass substrate. It will be appreciated by those of ordinary skill in the art, however, that other suitable substrates exist that may also be used, including, for example, those formed of CMOS-grade silicon. Therefore, the present disclosure is not meant to be limited to any one particular type of substrate.

With respect to FIGS. 8 and 9a, the method 100 further comprises a step 104 of depositing and patterning a first metal layer 202 on the substrate 200 to form, for example, a portion of one or more of the passive components (e.g., the bottom (i.e., sense and actuation) electrodes of the capacitors and/or switches described above, bottom electrodes of MIM capacitors, etc.), or one or more interconnects that may be used to connect various components of the system disposed on the substrate 200. In an exemplary embodiment, the metal layer 202 deposited and patterned in step 104 comprises gold. More particularly, in an exemplary embodiment, the metal layer 202 comprises a combination of 300 A° thick chromium, 5000 A° thick gold, and 300 A° thick chromium, though the present disclosure is not meant to be so limited. The first metal layer 202 may be deposited and patterned in a number of ways known in the art. In one embodiment provided for exemplary purposes only, a lift-off process is employed, though the present disclosure is not meant to be limited to such a technique or process. In an embodiment wherein a lift-off process is used, the step 104 may comprise a number of substeps. For example, first a layer of photoresist material is applied to all or a portion of the substrate 200. Next, the photoresist material is removed from the areas of the substrate 200 where the metal is to be placed using techniques well known in the art. The first metal layer 202 is then deposited on all or a portion of the substrate 200. The photoresist material and the portion of the metal layer 202 deposited on the photoresist material are then removed from the substrate 200.

Following the depositing and patterning of the first metal layer 202 in step 104, a step 106 comprises depositing and patterning a dielectric layer 204. As illustrated in FIG. 9b, in an exemplary embodiment, step 106 comprises depositing and patterning the dielectric layer over the first metal layer 202. More particularly, in an embodiment wherein a portion of the first metal layer 202 serves to form one or more bottom electrodes of one or more capacitors or capacitive switches, the dielectric layer 204 may be patterned to encompass one or more of those bottom electrodes. In an exemplary embodiment, the dielectric layer 204 deposited and patterned in step 106 comprises aluminum oxide ($Al_2O_3$). More particularly, in an exemplary embodiment, the dielectric layer 204 comprises a 500-1000 A° thick layer of $Al_2O_3$, though the present disclosure is not meant to be so limited. The dielectric layer 204 may be deposited and patterned in a number of ways known in the art. In one embodiment provided for exemplary purposes only, the dielectric layer 204 is deposited using an atomic layer deposition (ALD) tool, and patterned using a suitable aluminum etchant, though the present disclosure is not meant to be limited to such techniques or processes.

Once the dielectric layer 204 is deposited and patterned in step 106, in an exemplary embodiment wherein the system includes one or more switched capacitors comprising a capacitive switch, the method 100 may further comprise a step 108 of depositing and patterning another metal layer (not shown). More particularly, step 108 may comprise patterning a metal layer onto the dielectric layer 204 of a capacitive switch. The purpose of adding this additional metal layer is that surface of the dielectric material may be rough and/or the top electrode of the capacitive switch may be warped and so the contact between the top electrode of the capacitive switch and the dielectric material may not be ideal or optimal. Therefore, at the pull-down state, the capacitance of the capacitive switch may be limited to the contact area. By adding the metal layer on top of the dielectric, the capacitance value of the capacitive switch becomes independent of the contact area, and this, can be improved. Step 108 may be performed in the same or similar manner as step 104 described above, and therefore, the description will not be repeated here.

With reference to FIGS. 8, 9c, and 9d, in an exemplary embodiment, the method 100 may further include a step 110 of depositing and patterning a first sacrificial layer 206. More particularly, step 110 may comprise patterning the first sacrificial layer on top of at least a portion of the dielectric layer 204 (as shown in FIG. 9c) and/or the first metal layer 202 (or the metal layer resulting from step 108 above). In an exemplary embodiment wherein a portion of the first metal layer 202 comprises one or more bottom electrodes of one or more capacitors, switches, or capacitive switches, for example, the step 110 comprises patterning the sacrificial layer 206 to encompass one or more of the bottom electrode(s), and, if present, both the bottom electrode and the dielectric layer 204 disposed thereon. The sacrificial layer 206 is applied and patterned to define at least a portion of one or more gaps of one or more components, such as, for example, the actuation and sense gaps of the capacitors and switches described above, and gaps between interconnects (e.g., underpass interconnects) formed by metal layer 202 and components disposed thereabove. The particular material used for the sacrificial layer 206 is at least in part dependent upon the particular techniques and materials used in the other steps of the method 100. The sacrificial layer 206 may comprise, for example and without limitation, materials such as polymers, metals, silicon dioxide, and amorphous silicon, to name a few.

In an exemplary embodiment, the sacrificial layer 206 comprises poly-methylmethacrylate (PMMA). In such an embodiment, the depositing and patterning of the PMMA may be performed using any number of techniques known in the art. In an exemplary embodiment, the depositing and patterning may comprise a number of substeps. For example, in one embodiment a layer of PMMA is first applied to the entire substrate 200 and the aforementioned layers already disposed thereon, followed by a layer of titanium tungsten (TiW) (e.g., having a thickness of approximately 500 A°) on top of the PMMA layer. A layer of photoresist is then applied on top of the TiW. Next, the photoresist is patterned to remove photoresist material from areas in which no PMMA is desired. In the areas where the photoresist is removed, the TiW will be exposed. The TiW is then etched and the photoresist material is removed. The PMMA in those areas where there is no TiW is removed using, for example $O_2$ plasma. The remaining TiW is removed using, for example, a hydrogen peroxide ($H_2O_2$) solution.

In an exemplary embodiment, and with reference to FIGS. 8 and 9e, following the deposition and patterning of the first sacrificial layer 206, the method 100 further comprises the step 112 of electroplating a second metal layer 208. More particularly, step 112 may comprise electroplating the second metal layer 208 on top of a portion of the sacrificial layer 206 and/or the substrate 200 or the other layers disposed thereon. The second metal layer 208 serves to form, for example, a portion of one or more of the passive components (e.g., the top electrodes or membranes of the capacitors and/or switches described above, the top electrodes of MIM capacitors, etc. of the switched capacitors described above, etc.) or one or more interconnects that may be used to connect various components of the system. In an exemplary embodiment, the electroplated second metal layer 208 comprises gold. More particularly, in an exemplary embodiment, the second metal layer 208 comprises a 4 µm thick layer of gold, though the present disclosure is not meant to be so limited. As is known in the art, the electroplating step 112 may comprise a number of substeps. For example, first, a seed layer of metallic material is applied to the entire substrate 200 and the aforementioned layers already disposed thereon. Next, a photoresist mold is applied to the wafer and patterned to cover areas of the substrate where the second metal layer 208 is not to be applied (e.g., over portions of the first metal layer 202, for example). After the mold is applied, the substrate 200 is electroplated to form the second metal layer 208. The mold and seed layer are then removed. In one exemplary embodiment, the second metal layer 208 is electroplated using a BDT-20 solution at 50° C. and with a current density of 2 mA/cm$^2$, though the present disclosure is not meant to be so limited.

As illustrated in FIGS. 8 and 9f, the method 100 may further comprise a step 114 of depositing and patterning a second sacrificial layer 210. More particularly, step 114 may comprise patterning the second sacrificial layer 210 on top of at least a portion of, for example, the electroplated second metal layer 208, the first metal layer 202, or the substrate 200 with the aforementioned layers disposed thereon. The purpose of the second sacrificial layer 210 is to define a gap between the portions of the already existing layers (e.g., layers 202, 204, 206) and a third metal layer (e.g., metal layer 212) to be described in a subsequent step. In an exemplary embodiment, the second sacrificial layer 210 comprises a photoresist material, such as, for example, Shipley 1813 photoresist, and it may be deposited and patterned using techniques well known in the art.

Following the deposition and patterning of the second sacrificial layer 210, and with reference to FIGS. 8 and 9g, the method 100 may further comprise a step 116 of electroplating a third metal layer 212. More particularly, step 116 may comprise electroplating a third metal layer onto at least a portion of the second sacrificial layer 210, the substrate 200, and/or the aforementioned layers already disposed on the substrate 200. The third metal layer 212 may be provided to form routing layers or interconnects between different components of the system, and/or to form one or more electrical components or portions thereof, such as, for example, one or more high quality factor inductors (e.g., the inductors of the filter 58 described above). In an exemplary embodiment, the third metal layer 212 comprises copper. More particularly, in an exemplary embodiment, the third metal layer 212 comprises a 35 µm thick copper layer, though the present disclosure is not meant to be so limited. As is known in the art, and as was described with respect to the electroplating step 112 above, the electroplating step 116 may comprise a number of substeps. For example, first, a seed layer of metallic material may be applied to the entire substrate 200 and the aforementioned layer disposed thereon. Next, a photoresist mold is applied to the substrate 200 and patterned to cover areas of the substrate where the third metal layer 212 is not to be applied (e.g., over portions of the first and second metal layers, for example). After the mold is applied, the substrate is electroplated to form the third metal layer 212. The mold and seed layer are then removed.

Following the electroplating step 116, or following the electroplating step 112 in an embodiment wherein the method 100 does not include either step 114 (i.e., applying the second sacrificial) or step 116, the method may further comprise a step 118 of removing the sacrificial layer(s). In an exemplary embodiment, the sacrificial layers 206, 210 may be removed using any number of techniques known in the art, such as, for example, using a suitable photoresist stripper followed by acetone. In another exemplary embodiment, and as is known in the art, the sacrificial layers 206, 210 may be removed using O$_2$ plasma. Following the removal of the sacrificial layer(s), a critical point dryer may be used to alleviate or avoid stiction between the released metal layers and the layers underneath the released metal layers.

It is to be understood that the foregoing description is of one or more embodiments of the invention. The invention is not limited to the particular embodiment(s) disclosed herein, but rather is defined solely by the claims below. Furthermore, the statements contained in the foregoing description relate to the disclosed embodiment(s) and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A wide range tunable capacitor bank, comprising:
   a variable capacitor, the capacitance value of which is adjustable within a predetermined capacitance range defined by a minimum capacitance value and a maximum capacitance value; and
   one or more switched capacitors electrically connected to the variable capacitor,
   wherein each of the one or more switched capacitors has a first capacitance value corresponding to an un-actuated state and a second capacitance value corresponding to an actuated state, and further wherein the second capacitance value is greater than the first capacitance value and less than or equal to the maximum capacitance value of the variable capacitor, and
   further wherein the variable capacitor is configured to allow the capacitance value thereof to be adjusted within the predetermined capacitance range and the one or more switched capacitors are configured to be selectively actuated to permit continuous tuning of the capacitor bank over a second capacitance range that is greater than the predetermined capacitance range.

2. The capacitor bank of claim 1, wherein the second capacitance range extends from one of the minimum and maximum capacitance values of the predetermined capacitance range to beyond the other one of the minimum and maximum capacitance values of the predetermined capacitance range.

3. The capacitor bank of claim 1, wherein the one or more switched capacitors comprises a plurality of switched capacitors, and further wherein each of the plurality of switched capacitors is electrically connected to the variable capacitor and to each of the other ones of the plurality of switched capacitors.

4. The capacitor bank of claim 1, wherein the variable capacitor is a micro-electromechanical system (MEMS) variable capacitor, and the one or more switched capacitors are MEMS switched capacitors.

5. The capacitor bank of claim 1, wherein each of the one or more switched capacitors comprises one of:
a combination of an ohmic switch and a capacitor;
a capacitive switch; and
a combination of a phase change switch and a capacitor.

6. An electrical circuit, comprising:
one or more resonator circuits, wherein each of the one or more resonator circuits comprises:
a continuously tunable capacitor bank, the capacitor bank comprising
a variable capacitor, the capacitance value of which is adjustable within a predetermined capacitance range defined by a minimum capacitance value and a maximum capacitance value, and
one or more switched capacitors electrically connected to the variable capacitor,
wherein each of the one or more switched capacitors has a first capacitance value corresponding to an un-actuated state and a second capacitance value corresponding to an actuated state, and further wherein the second capacitance value is greater than the first capacitance value and less than or equal to the maximum capacitance value of the variable capacitor, and
further wherein the variable capacitor is configured to allow the capacitance value thereof to be adjusted within the predetermined capacitance range and the one or more switched capacitors are configured to be selectively actuated to permit continuous tuning of the capacitor bank over a second capacitance range that is greater than the predetermined capacitance range; and
at least one inductive element electrically connected to the continuously tunable capacitor bank.

7. The electrical circuit of claim 6, wherein the one or more resonator circuits comprises a plurality of resonator circuits, and each of the plurality of resonator circuits is capacitively or inductively coupled to at least one other of the plurality of resonator circuits.

8. The electrical circuit of claim 7, wherein the plurality of resonator circuits combine to form at least a portion of one of a RF filter, a tunable antenna, a phase shifter, a balun, and a matching network.

9. The electrical circuit of claim 7, wherein the plurality of resonator circuits comprises three (3) resonator circuits.

10. The electrical circuit of claim 7, further comprising a single bias voltage line electrically coupled to the variable capacitor of each of the plurality of capacitor banks to allow for the simultaneous adjustment of the capacitance values of the variable variable capacitors.

11. The electrical circuit of claim 7, further comprising:
a first port and a second port; and
a first matching inductive element and a second matching inductive element;
wherein the plurality of resonator circuits are disposed between the first and second ports, and further wherein the first matching inductive element is electrically connected between the first port and a first of the plurality of resonator circuits, and the second inductive element is electrically connected between a second of the plurality of resonator circuits and the second port.

12. The electrical circuit of claim 7, wherein the plurality of resonator circuits are integrated on a single substrate to form an integrated micro-electromechanical system (MEMS).

13. A wide range tunable capacitor bank, comprising:
a variable capacitor, the capacitance value of which is adjustable within a predetermined capacitance range defined by a minimum capacitance value and a maximum capacitance value; and
one or more switched capacitors electrically connected to the variable capacitor;
wherein the variable capacitor is configured to allow the capacitance value thereof to be adjusted within the predetermined capacitance range and the one or more switched capacitors are configured to be selectively actuated to permit continuous tuning of the capacitor bank over a second capacitance range that is greater than the predetermined capacitance range, and
further wherein each of the one or more switched capacitors comprises a combination of a switch and a second variable capacitor, the capacitance value of the second variable capacitor of each of the one or more switched capacitors being adjustable within a predetermined capacitance range corresponding thereto; and still further wherein each of the one or more switched capacitors is configured such that when the switch thereof is actuated, the corresponding second variable capacitor is configured to allow the capacitance value thereof to be adjusted within the predetermined capacitance range corresponding thereto to permit the further wide range tuning of the capacitor bank.

14. An electrical circuit, comprising:
one or more resonator circuits, wherein each of the one or more resonator circuits comprises:
a continuously tunable capacitor bank, the capacitor bank comprising the capacitor bank of claim 13; and
at least one inductive element electrically connected to the continuously tunable capacitor bank.

15. The electrical circuit of claim 14, wherein the one or more resonator circuits comprises a plurality of resonator circuits, and each of the plurality of resonator circuits is capacitively or inductively coupled to at least one other of the plurality of resonator circuits.

16. The electrical circuit of claim 15, further comprising:
a first port and a second port; and
a first matching inductive element and a second matching inductive element;
wherein the plurality of resonator circuits are disposed between the first and second ports, and further wherein the first matching inductive element is electrically connected between the first port and a first of the plurality of resonator circuits, and the second inductive element is electrically connected between a second of the plurality of resonator circuits and the second port.

17. The electrical circuit of claim 15, wherein the plurality of resonator circuits are integrated on a single substrate to form an integrated micro-electromechanical system (MEMS).

18. The electrical circuit of claim 15, further comprising a single bias voltage line electrically coupled to the variable capacitor of each of the plurality of capacitor banks to allow for the simultaneous adjustment of the capacitance values of the respective variable capacitors.

19. The capacitor bank of claim 13, wherein the variable capacitor is a micro-electromechanical system (MEMS) variable capacitor, and the one or more switched capacitors are MEMS switched capacitors.

20. The capacitor bank of claim 13, wherein the one or more switched capacitors comprises a plurality of switched capacitors, and further wherein each of the plurality of switched capacitors is electrically connected to the variable capacitor and to each of the other ones of the plurality of switched capacitors.

21. The capacitor bank of claim 13, wherein the second capacitance range extends from one of the minimum and maximum capacitance values of the predetermined capacitance range to beyond the other one of the minimum and maximum capacitance values of the predetermined capacitance range.

* * * * *